(12) United States Patent
Asano (10) Patent No.: US 7,046,982 B2
(45) Date of Patent: May 16, 2006

(54) HIGH FREQUENCY DEVICE HAVING A FRAME WITH SEGMENTED COMPARTMENTS FOR PREVENTED UNWANTED SIGNAL PROPAGATION

(75) Inventor: Hiromasa Asano, deceased, late of Aichi (JP); by Noriko Asano, legal representative, Aichi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 10 days.

(21) Appl. No.: 10/450,082

(22) PCT Filed: Oct. 2, 2002

(86) PCT No.: PCT/JP02/10261

§ 371 (c)(1),
(2), (4) Date: Oct. 15, 2003

(87) PCT Pub. No.: WO03/032703

PCT Pub. Date: Apr. 17, 2003

(65) Prior Publication Data

US 2004/0077329 A1   Apr. 22, 2004

(30) Foreign Application Priority Data

Oct. 3, 2001   (JP) .............................. 2001-307257

(51) Int. Cl.
*H04B 1/08* (2006.01)

(52) U.S. Cl. .................. 455/349; 334/85; 361/816
(58) Field of Classification Search .............. 334/85; 361/816, 820, 821; 455/347, 349
See application file for complete search history.

(56) References Cited

U.S. PATENT DOCUMENTS

| 4,404,617 A | * | 9/1983 | Ohyama et al. | ............ 361/818 |
| 4,648,128 A | * | 3/1987 | Saka et al. | .................. 455/301 |

FOREIGN PATENT DOCUMENTS

| JP | 57-173400 | 11/1982 |
| JP | 04-117801 | 4/1992 |
| JP | 06-085501 | 3/1994 |
| JP | 10-084194 | 3/1998 |
| JP | 11-031891 | 2/1999 |
| JP | 11-144962 | 5/1999 |
| JP | 2000-032360 | 1/2000 |
| JP | 2000-244169 | 9/2000 |

\* cited by examiner

*Primary Examiner*—Benny Lee
(74) *Attorney, Agent, or Firm*—RatnerPrestia (57) ABSTRACT

A high-frequency device includes plural high-frequency circuits mounted on a printed circuit board, a partition for protects the circuits from leakage or radiation of undesired signals, and a case for accommodating the printed circuit board. The partition is formed of a frame surrounded by a bottom surface of the case, bent-up strips, contact lugs, and a lid. The frame has sides shorter than the wavelength of the undesired signal. The frame reduces limitation in an arrangement of the components on the board.

22 Claims, 4 Drawing Sheets

PRIOR ART

Fig. 8

PRIOR ART

US 7,046,982 B2

HIGH FREQUENCY DEVICE HAVING A FRAME WITH SEGMENTED COMPARTMENTS FOR PREVENTED UNWANTED SIGNAL PROPAGATION

This Application is a U.S. National Phase Application of PCT International Application PCT/JP02/10261.

TECHNICAL FIELD

The present invention relates to a high-frequency device including plural high-frequency circuits, in which the high-frequency circuits are prevented from leakage and radiation of undesired high-frequency signals between the circuits.

BACKGROUND ART

Figure 7:
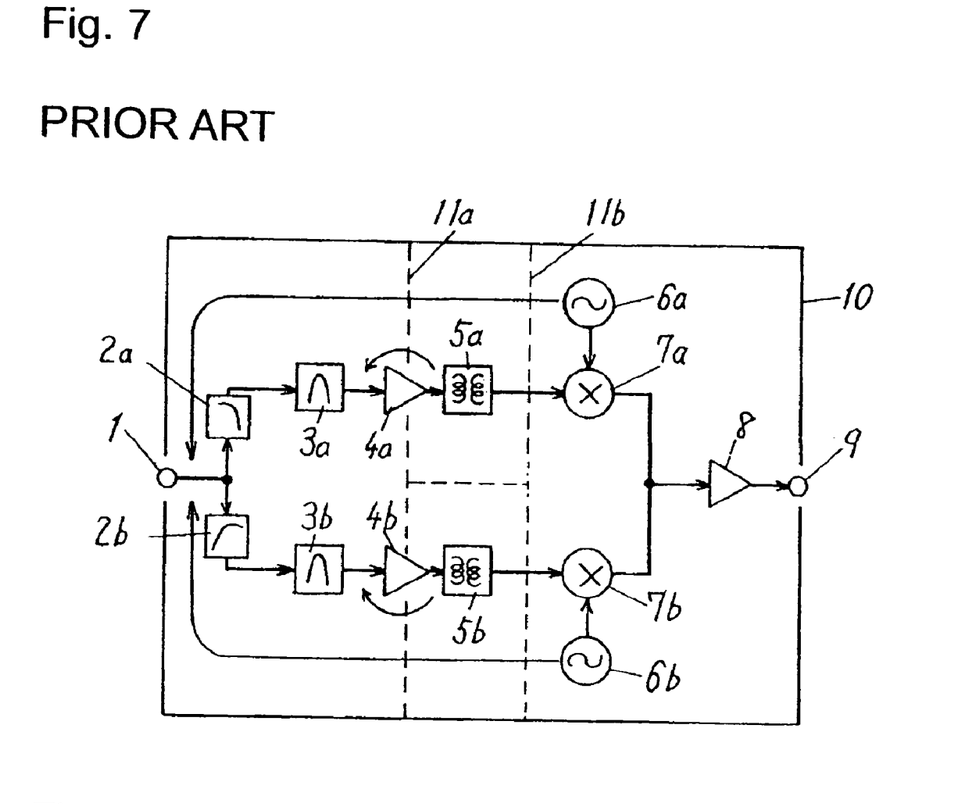
FIG. 7 is a block diagram of a VHF/UHF tuner as a conventional high-frequency device.

A VHF/UHF tuner 10 for receiving television (TV) signals as a conventional high-frequency device will be described. As shown in FIG. 7, the VHF/UHF tuner 10 includes a VHF section and a UHF section. Since the sections are almost the same in structure, the VHF section will be explained. The VHF section includes input terminal 1 for receiving the TV signals, low-pass filter (LPF) 2a coupled to input terminal 1, tuning filter 3a coupled to an output of LPF 2a, high-frequency amplifier 4a coupled to an output of tuning filter 3a, inter-stage filter 5a coupled to an output of high-frequency amplifier 4a, mixer 7a having an input port coupled to an output of inter-stage filter 5a and another input port coupled to an output of local oscillator 6a, intermediate-frequency amplifier 8 coupled to an output of mixer 7a, and output terminal 9 coupled to an output of intermediate-frequency amplifier 8.

The UHF section includes high-pass filter 2b instead of low-pass filter 2a in the VHF section. That is, filters 2a and 2b separates the received signals into VHF signals and UHF signals. Other than this are substantially identical to each other between the two sections except for handling frequencies of different bandwidths. For simple explanation, components of the UHF section commonly used in the VHF section are denoted by corresponding reference numerals with a subscript "b". Input terminal 1, intermediate-frequency amplifier 8, and output terminal 9 are shared between the two sections.

Figure 8:
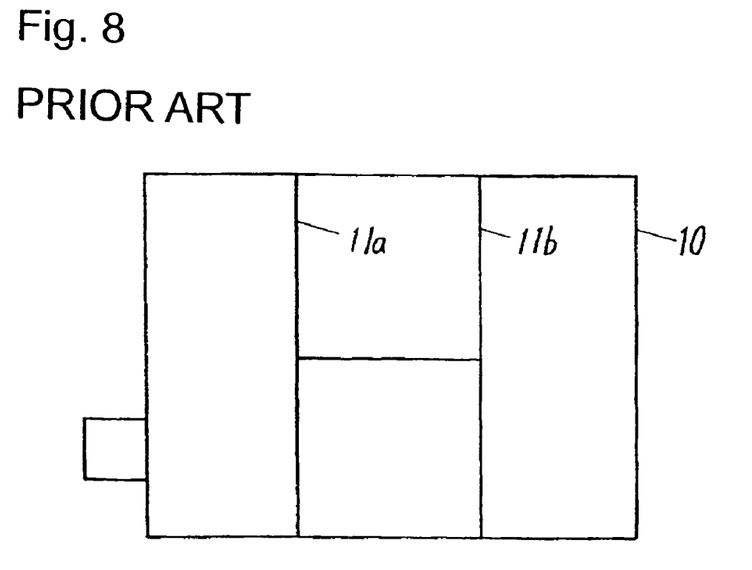
FIG. 8 is a plan view of the VHF/UHF tuner of FIG. 7.

The aforementioned circuits are formed on a printed circuit board, and are accommodated, as shown in FIG. 8, in metallic shield case 10. To avoid interference between circuits, these circuits are isolated from each other by metallic partitions 11a, 11b in high frequencies.

Partition 11a is located between tuning filters 3a, 3b and inter-stage filters 5a, 5b, and more specifically, located above transistors in high-frequency amplifiers 4a and 4b. If outputs from high-frequency amplifiers 4a and 4b return upstream, abnormal oscillation may occurs. Partition 11a is inserted to avoid the inconvenience.

Partition 11b is located between local oscillators 6a, 6b and inter-stage filters 5a, 5b. Partition 11b blocks leakage of signals generated by local oscillators 6a and 6b through input terminal 1 to the outside, which may affects other televisions. For designing a device that uses public radio waves with others, it is important to avoid affecting others. The leakage of signals is thus double-blocked by partitions 11b and 11a.

In order to block the leakage and radiation of undesired high frequencies, partitions 11a and 11b are made of metal, and isolates electrically and mechanically between the circuits. In particular, mechanically isolated, the circuits include components which are limited in their arrangement.

SUMMARY OF THE INVENTION

A high-frequency device includes a board, plural high-frequency circuits provided on the board, and a partition located between the high-frequency circuits and including a frame made of conductive material. The frame prevents a signal generated in the high-frequency circuits from passing through said frame. The high-frequency device is not limited in arrangement of components.

DETAILED DESCRIPTION OF THE PREFERRED EMBODIMENT

Figure 1:
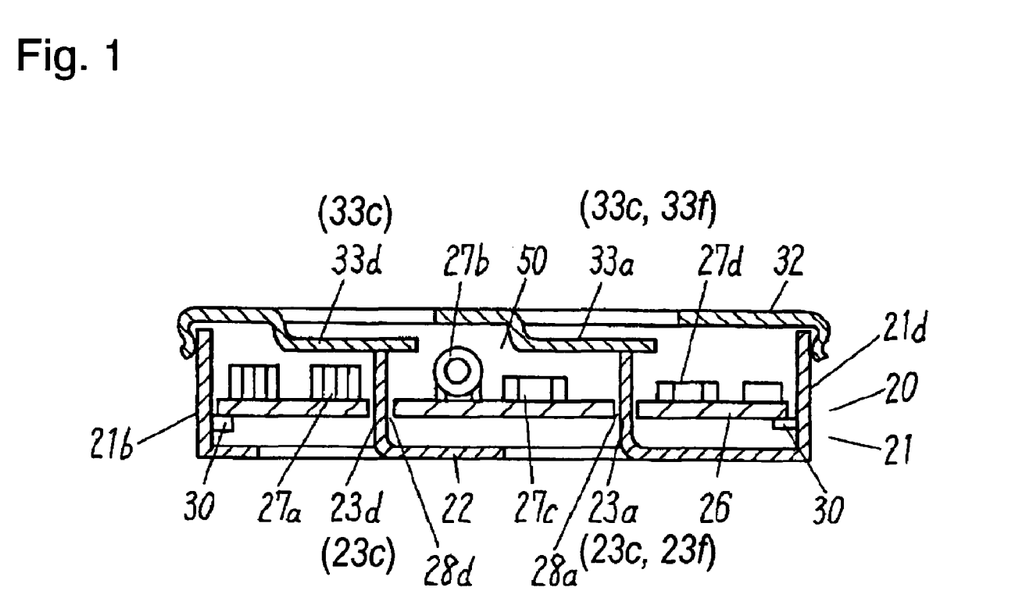
FIG. 1 is a sectional view of a high-frequency device according to an exemplary embodiment of the present invention.
Figure 2:
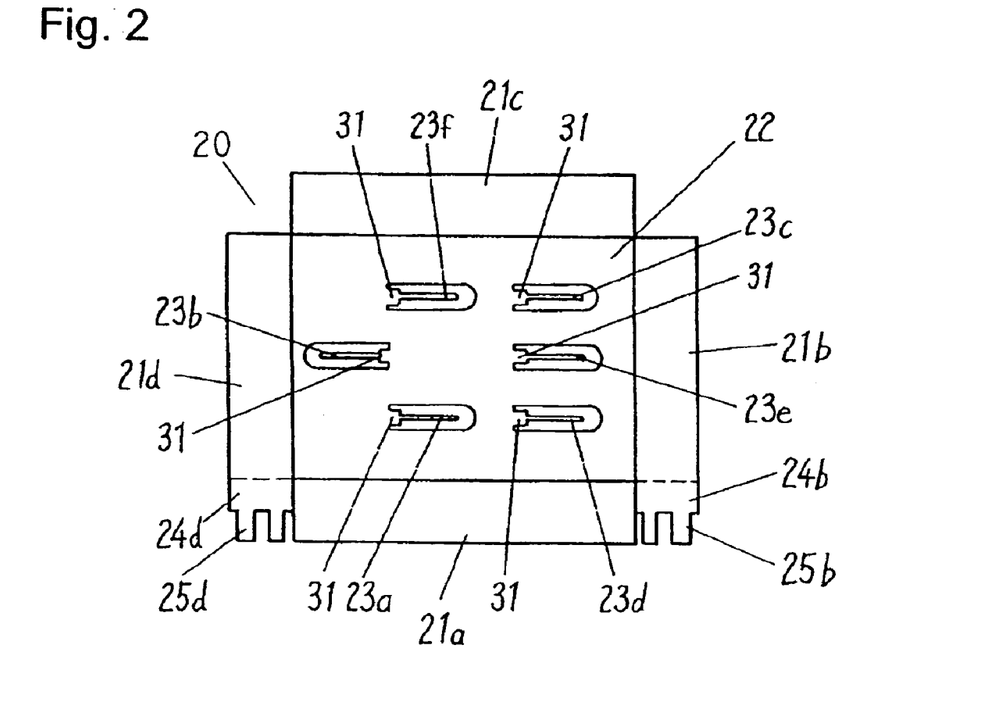
FIG. 2 is an exploded view of a shield case of the high-frequency device according to the embodiment.

FIG. 1 is a sectional view of a high-frequency device according to an exemplary embodiment of the present invention. FIG. 2 shows an exploded view of a shield case of the high-frequency device. As shown in FIG. 1 and FIG. 2, metallic shield case 20 has bottom 22 and sides 21a, 21b, 21c, and 21d formed by bending each side of a rectangular plate. Bent-up strips 23a, 23b, 23c, 23d, 23e, and 23f are formed on bottom 22 by bending up a portion of the bottom.

Legs 24b and 24d are formed unitarily with sides 21b and 21d, respectively. Similarly, insert portions 25b and 25d are formed with legs 24b and 24d, respectively. Insert portions 25b and 25d are inserted into a printed circuit board for having high-frequency components mounted thereon, and are soldered with the circuit board.

As shown in FIG. 1, single-sided printed circuit board 26 having a high-frequency circuit mounted thereon is accommodated in shield case 20. On the top surface of printed circuit board 26, high-frequency electronic components including core-less coils 27a, 27b, and chip component 27c are mounted by reflow soldering.

Printed circuit board 26 has holes 28a and 28d into which bent-up strips 23a and 23d are inserted then soldered, respectively. Bent-up strips 23a and 23d have holders 31 at their bases, as shown in FIG. 2. Holder 31 supports printed circuit board 26. Printed circuit board 26 is held and secured mainly by lug 30 located on side 21 of shield case 20.

Metallic lid 32 for covering shield case 20 has contact lugs 33a and 33c, 33d, 33f corresponding to bent-up strips 23a and 23c to 23f of case 20. Bent-up strips 23b appears in FIG. 2. Contact lugs 33a and 33c, 33d, 33f are elastic so that the lugs elastically contacts strips 23a and 23c, 23d, 23f, respectively. For example, in FIG. 1., bottom 22, bent-up strips 23a and 23c, 23d, 23f, contact lugs 33a and 33c, 33d, 33f, and lid 32 form frame 50 made of conductive material. Frame 50 has a side shorter than the wavelength of a signal generated in the high-frequency device mounted on the printed circuit board. In particular, the distances between strips 23a–23f, for example, the distance between strip 23a and strip 23d should be shorter than the wavelength of the signal. This prevents the signal from passing through the frame. Frame 50 serves not only as a partition of the high-frequency circuits, but also as a protector against interference between the circuits. In addition, electronic components 27c and 27d can be located within frame 50. In FIG. 1, frame 50 is located between core-less coils 27a and 27b, and located between chip components 27c and 27d.

Frame 50 of the embodiment has a rectangular shape, however, may have a round or oval shaped, providing the same effect. In this case, the round shape has a diameter shorter than the wavelength of an undesired signal, or the oval shape has a long-axis diameter shorter than the wavelength for blocking the signal.

Figure 3:
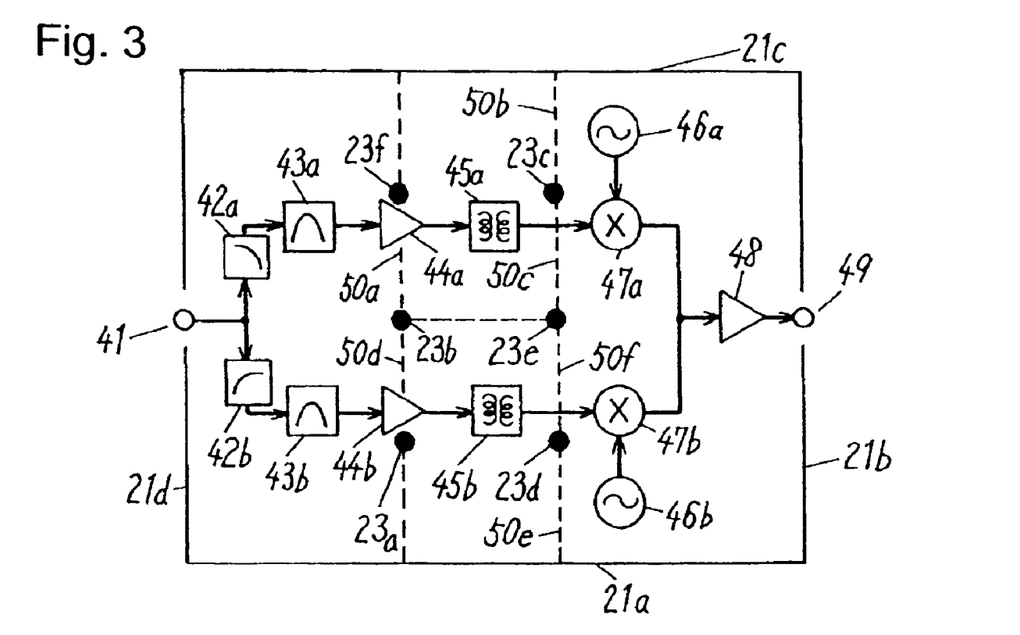
FIG. 3 is a block diagram of a VHF/UHF tuner as the high-frequency device of the embodiment.

FIG. 3 is a circuit diagram of a VHF/UHF tuner for receiving television (TV) signals as the high-frequency device of the embodiment. Sides 21a, 21b, 21c, and 21d are shown. Bent-up strips 23a, 23b, 23c, 23d, 23e, and 23f are shown. The VHF/UHF tuner includes a VHF section and a UHF section.

The VHF section includes input terminal 41 for receiving TV signals, low-pass filter (LPF) 42a coupled to input terminal 41, tuning filter 43a coupled to an output of LPF 42a, high-frequency amplifier 44a coupled to an output of tuning filter 43a, inter-stage filter 45a coupled to an output of high-frequency amplifier 44a, mixer 47a having an input port coupled to an output of inter-stage filter 45a and another input port coupled to an output of local oscillator 46a, intermediate frequency amplifier 48 coupled to an output of mixer 47a, and output terminal 49 coupled to an output of intermediate frequency amplifier 48.

The UHF section includes high-pass filter (HPF) 42b instead of LPF 42a in the VHF section. That is, filters 42a and 42b separate signals into VHF signals and UHF signals. Other portions of the two sections are substantially the same except handling frequencies of different bandwidths. For simple explanation, components of the UHF section commonly used in the VHF section are denoted by corresponding reference numerals followed by subscript "b". For example, tuning filter 43b and local oscillator 46b are shown. Input terminal 41, intermediate frequency amplifier 48, and output terminal 49 are shared between the two sections.

The VHF/UHF tuner having the structure above will be described. As described above, operations of the sections except their handling frequencies of different bandwidths are almost identical. Therefore, the VHF section will be mainly explained.

A VHF signal out of TV signals received at input terminal is supplied to tuning filter 43a through LPF 42a. A UHF signal out of the TV signals is supplied to tuning filter 43b through HPF 42b. That is, filters 42a and 42b separate the input signals into the VHF signal and the UHF signal. Hereinafter, the VHF signal will be mainly explained.

Tuning filter 43a has a variable center frequency, which allows frequencies near a desired center frequency to pass through the filter. An output of tuning filter 43a is supplied to inter-stage filter 45a via high-frequency amplifier 44a including a transistor. Frame 50a formed of bent-up strips 23b, 23f, bottom 22, and lid 32 (shown in FIG. 1) is located between an input section and an output section of amplifier 44a for preventing an output of high-frequency amplifier 44a from returning back upstream. Frame 50a has a side shorter than the wavelength of a frequency passing through amplifier 44a. Frame 50a having such structure therefore blocks the output from returning back to input terminal 41, and thus prevents the circuit from abnormal oscillation.

Inter-stage filter 45a has a sharp cut-off profile and a passing band narrower than tuning filter 43a, thus allowing only a desired frequency to pass through the filter. An output of the filter is supplied to one input port of mixer 47a for mixing the output with an output of local oscillator 46a received at another input port of mixer 47a. Mixer 47a outputs an intermediate frequency signal.

Frames 50b and 50c are located between local oscillator 46a, mixer 47a and inter-stage filter 45a to prevent leakage of a signal from local oscillator 46a to input terminal 41. Frame 50b is formed of side 21c, bent-up strip 23c, bottom 22, and lid 32. Similarly, frame 50c is formed of bent-up strips 23c and 23e, bottom 22, and lid 32. In other words, the output of local oscillator 46a has to pass through frame 50b, or frames 50a and 50c to reach input terminal 41. Frames 50b and 50c have sides shorter than the wavelength of the output of local oscillator 46a. Frames 50b and 50c having such structures can function as a barrier against the output of local oscillator 46a. That is, frames 50b and 50c can double-block the output of oscillator 46a from reaching input terminal 41.

The output of mixer 47a is amplified by intermediate frequency amplifier 48 and is then brought to output terminal 49.

Similarly to the VHF section, the UHF section includes frame 50d (shown in FIG. 3) located between an input port and an output port of high-frequency amplifier 44b to preventing an output of amplifier 44b from returning back to input terminal 41. Frame 50d is formed of bent-up strips 23a and 23b, bottom 22, and lid 32. Frame 50d has a side shorter than the wavelength of a frequency passing through amplifier 44b. Frame 50d having such structure therefore prevents the output from returning back to input terminal 41, thus protecting the circuit from abnormal oscillation.

Inter-stage filter 45b has a sharp cut-off profile and a passing band narrower than tuning filter 43b, thus allowing only a desired frequency to pass through. The output is supplied to one input port of mixer 47b for mixing the output with an output of local oscillator 46b received at another input port of mixer 47a. Mixer 47b outputs an intermediate frequency signal.

Frames 50e and 50f are located between local oscillator 46b, mixer 47b and inter-stage filter 45b in order to protect leakage of a signal from local oscillator 46b to input terminal 41. Frame 50e is formed of side 21a, bent-up strip 23d, bottom 22, and lid 32. Similarly, frame 50f is formed of bent-up strips 23d and 23e, bottom 22, and lid 32 (of FIG. 1). In other words, the oscillated output signal of local oscillator 46b has to pass through frame 50e, or frames 50f and 50d to reach input terminal 41. Frames 50e and 50f have sides shorter than the wavelength of the output of local oscillator 46b. That is, frames 50e and 50f can prevent the output of oscillator 46b from reaching input terminal 41.

Figure 4:
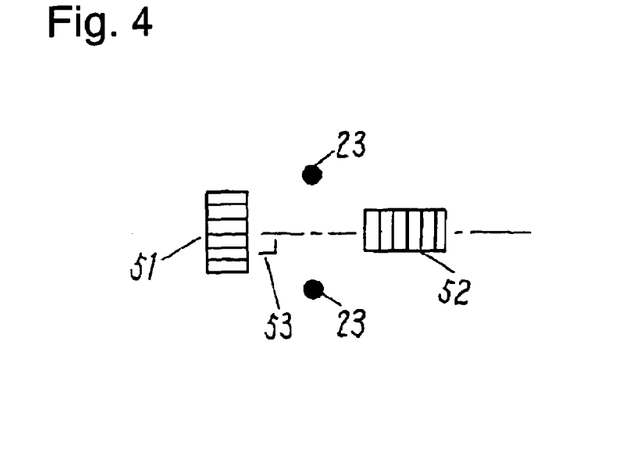
FIG. 4 is a plan view illustrating arrangement of air-core coils forming filters of the VHF/UHF tuner of the embodiment.

Next, a preferable arrangement of core-less coils 51 and 52 shown in FIG. 4 will be described. Core-less coil 51 forms tuning filter 43a or 43b (shown in FIG. 3), while core-less coil 52 forms inter-stage filter 45a or 45b (shown in FIG. 3). Frame 50 formed of bent-up strip 23, bottom 22, and lid 32 is located between core-less coils 51 and 52.

Frame 50 reduces electromagnetic coupling between coreless coils 51 and 52, thus preventing interference between the coils. To reduce the interference more, core-less coils 51 and 52 are located so that respective center axes of the coils are substantially perpendicular (angle 53) to each other, as shown in FIG. 4. This arrangement reduces the coupling between core-less coils 51 and 52, thus preventing the coils from interference.

Figure 5:
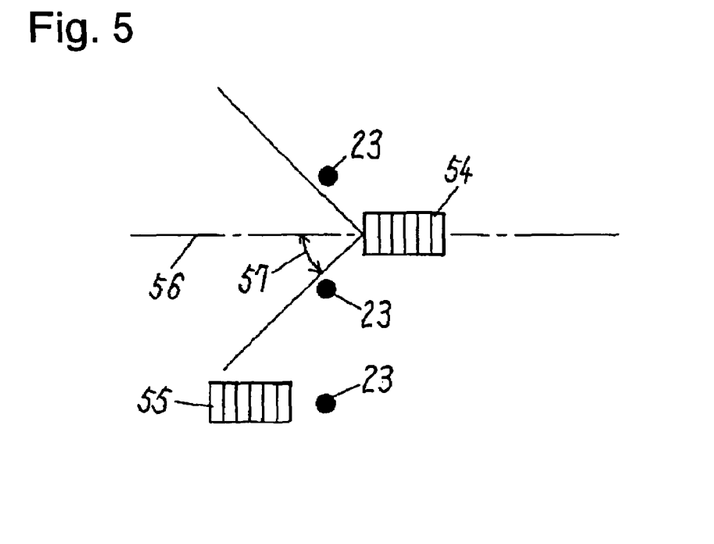
FIG. 5 is a plan view illustrating another arrangement of the air-core coils for the VHF/UHF tuner of the embodiment.

FIG. 5 shows an arrangement of core-less coils 54 and 55 having respective center axes parallel to each other. Bent-up strip 23 is again shown. Frame 50 formed of bent-up strip 23, bottom 22, and lid 32 is located between core-less coils 54 and 55, suppressing electromagnetic interference between the coils. In order to reduce the interference more, an opening angle 57 not narrower than 45° is provided from center axis 56 of core-less coil 54, and core-less coil 55 is located out of the opening angle. This arrangement reduces the coupling between core-less coils 54 and 55, thus preventing the coils from interference.

Figure 6:
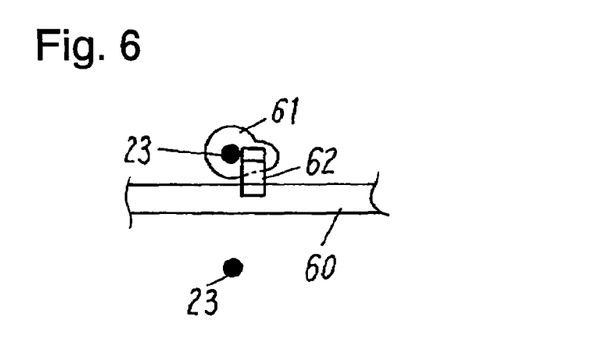
FIG. 6 is a plan view illustrating a vicinity of the partition located between high-frequency circuits of the VHF/UHF tuner of the embodiment.

FIG. 6 is a plan view of a vicinity of a frame located between high-frequency circuits of the VHF/UHF tuner of the embodiment. Power supply pattern 60 is located adjacent to bent-up strip 23 penetrating the printed circuit board. Chip capacitor 62 is mounted between power supply pattern 60 and land 61 formed around bent-up strip 23. Chip capacitor 62 having a capacitance greater than 1000 pF is connected directly to a ground (i.e., bent-up strip 23) can prevents interference waves through power supply pattern 60. Power supply pattern 60 being grounded via chip capacitor 62 reduces an impedance of pattern 60, thus protecting the circuit from undesired interference and electromagnetic coupling.

The VHF/UHF tuner having such structure is accommodated in shield case 20, as shown in FIGS. 1 and 2. The tuner does not require partitions 11a and 11b included in the conventional tuner. This structure can simplifies an arrangement of components, thereby contributing to a small, compact tuner. Furthermore, the structure allows the components of the tuner to be repaired and adjusted easily.

Since the high-frequency device of the embodiment can employ single-sided printed circuit board 26, the shield case can have side 21 by bending bottom 22, thus not needing a back lid. This structure simplifies not only the structure of the frame but also handling of the components. In addition, a single-sided printed circuit board has the components on its top surface, and does not have the components on bottom surface. Therefore, a shield case having the side formed by bending the bottom allows the components to be repaired and adjusted easily. A single-sided printed circuit board can also reduce the manufacturing cost of the device.

The high-frequency device of the embodiment reduces a limitation in an arrangement of the components which increases board density, thus having a reduced size.

The process of mounting component 27 on printed circuit board 26, and the process of fixing board 26 to shield case 20 can be simultaneously performed by reflow soldering.

The strip formed by bending up the case itself serves as a side of the frame according to the embodiment. A rod-like, or plate-like piece instead of the bent-up strip may provides the same effect. In this case, the aforementioned piece is prepared separately from the case, and is then connected with the case.

The above description has related to the positioning of an electronic component on a first surface of a printed circuit board. It is understood, however, by one of ordinary skill in the art that a wiring pattern may be provided on a second surface of the printed circuit board.

INDUSTRIAL APPLICABILITY

In a high-frequency device according to the present invention, a conductive material-made frame serves as a partition between high-frequency electronic circuits. The frame has sides shorter than the wavelength of an undesired signal. The frame prevents leakage or radiation of undesired high frequencies. The high-frequency device employing the frame reduces limitation in an arrangement of the components mounted on a printed circuit board. This fact improves board density, thereby reducing the size of the device.

The invention claimed is:

1. A high-frequency device comprising:
   a board;
   a plurality of high-frequency circuits provided on said board;
   a partition located between said high-frequency circuits, said partition including a frame comprised of conductive material,
   a case for accommodating said circuit board, said case being made of metal;
   a lid for covering said case, said lid being made of metal; and
   a strip provided at a bottom surface of said case and contacting said lid,
   wherein said frame is formed of said strip, said case, and said lid and prevents a signal generated in said high-frequency circuits from passing through said frame.

2. The high-frequency device of claim 1, wherein said frame has a substantially rectangular shape having sides shorter than a wavelength of said signal.

3. The high-frequency device of claim 1, further comprising:
   an electronic component located on a first surface of said board;
   wherein said board is a single-sided board, and a second surface of said board faces to said bottom surface or said case.

4. The high-frequency device of claim 1, further comprising an elastic contact lug provided on said lid which protrudes towards said bottom surface of said case, said contact lug contacting a tip of said strip.

5. The high-frequency device of claim 4, wherein said contact lug is formed by cutting and bending said lid.

6. The high-frequency device of claim 1, wherein said strip is formed by cutting and bending up said bottom surface of said case.

7. The high-frequency device of claim 6, further comprising an elastic contact lug provided on said lid which protrudes towards said bottom surface of said case, said contact lug contacting a tip of said strip.

8. The high-frequency device of claim 7, wherein said contact lug is formed by cutting and bending said lid.

9. The high-frequency device of claim 1, wherein a side and said bottom surface of said case are formed by bending a metal plate.

10. The high-frequency device of claim 1, further comprising;
    a power supply line located on said board and running through said partition; and
    a capacitor provided between said power supply line and said strip, said strip being located near said power supply line.

11. The high-frequency device of claim 1, further comprising:
    an input terminal provided on said board, for receiving a high-frequency signal;

a first filter provided on said board and coupled to said input terminal;

a high-frequency amplifier provided on said board and coupled to an output of said first filter;

a second filter provided on said board and coupled to an output of said high-frequency amplifier;

a local oscillator provided on said board;

a mixer provided on said board and having one input port coupled to an output of said second filter, and another input port coupled to an output of said local oscillator;

an intermediate frequency amplifier provided on said board and coupled to an output of said mixer; and an output terminal provided on said board and coupled to an output of said intermediate frequency amplifier, wherein said partition is located at said high-frequency amplifier.

12. The high-frequency device of claim 11, wherein said first filter and said second filter include coils, respectively, and one of said coils is located at a position out of an opening angle not less than 45° from a center axis of other of said coils.

13. The high-frequency device of claim 11, further comprising another partition located between said local oscillator and said second filter, said another partition including a frame comprised of conductive material located between said high-frequency circuits.

14. The high-frequency device of claim 11, wherein said first filter and said second filter include coils, respectively, and said coils have respective center axes substantially perpendicular to each other.

15. A high-frequency device comprising:

a board;

a plurality of high-frequency circuits provided on said board;

a partition located between said high-frequency circuits, said partition including a frame made of conductive material;

an input terminal provided on said board, for receiving a high-frequency signal;

a first filter provided on said board and coupled to said input terminal;

a high-frequency amplifier provided on said board and coupled to an output of said first filter;

a second filter provided on said board and coupled to an output of said high-frequency amplifier;

a local oscillator provided on said board;

a mixer provided on said board and having one input port coupled to an output of said second filter, and another input port coupled to an output of said local oscillator;

an intermediate frequency amplifier provided on said board and coupled to an output of said mixer; and an output terminal provided on said board and coupled to an output of said intermediate frequency amplifier, wherein said frame prevents a signal generated in said high-frequency circuits from passing through said frame, wherein said partition is located at said high-frequency amplifier, and wherein said first filter and said second filter include coils, respectively, and said coils have respective center axes substantially perpendicular to each other.

16. The high-frequency device of claim 15, wherein said frame has a substantially rectangular shape having sides shorter than a wavelength of said signal.

17. The high-frequency device of claim 15, further comprising another partition located between said local oscillator and said second filter, said partition including a frame made of conductive material located between said high-frequency circuits.

18. A high-frequency device comprising:

a board;

a plurality of high-frequency circuits provided on said board;

a partition located between said high-frequency circuits, said partition including a frame made of conductive material;

an input terminal provided on said board, for receiving a high-frequency signal;

a first filter provided on said board and coupled to said input terminal;

a high-frequency amplifier provided on said board and coupled to an output of said first filter;

a second filter provided on said board and coupled to an output of said high-frequency amplifier;

a local oscillator provided on said board;

a mixer provided on said board and having one input port coupled to an output of said second filter, and another input port coupled to an output of said local oscillator;

an intermediate frequency amplifier provided on said board and coupled to an output of said mixer; and an output terminal provided on said board and coupled to an output of said intermediate frequency amplifier, wherein said frame prevents a signal generated in said high-frequency circuits from passing through said frame, wherein said partition is located at said high-frequency amplifier, and wherein said frame has a substantially rectangular shape having sides shorter than a wavelength of said signal.

19. The high-frequency device of claim 18 further comprising another partition located between said local oscillator and said second filter said another partition including a frame made of conductive material located between said high-frequency circuits.

20. A high-frequency device comprising;

a board;

a plurality of high-frequency circuits provided on said board;

a partition located between said high-frequency circuits, said partition including a frame made of conductive material;

an input terminal provided on said board, for receiving a high-frequency signal;

a first filter provided on said board and coupled to said in put terminal;

a high-frequency amplifier provided on said board and coupled to an output of said first filter;

a second filter provided on said board and coupled to an output of said high-frequency amplifier;

a local oscillator provided on said board;

a mixer provided on said board and having one input port coupled to an output of said second filter, and another input port coupled to an output of said local oscillator;

an intermediate frequency amplifier provided on said board and coupled to an output of said mixer; and an output terminal provided on said board and coupled to an output of said intermediate frequency amplifier, wherein said frame prevents a signal generated in said high-frequency circuits from passing through said frame, wherein said partition is located at said high-frequency amplifier, and wherein said first filter and said second filter include coils, respectively, and one of said coils is located at a position out of an opening angle not less than 45° from a center axis of other of said coils.

21. The high-frequency device of claim 20, wherein said frame has a substantially rectangular shape having sides shorter than a wavelength of said signal.

22. The high-frequency device of claim 20, further comprising another partition located between said local oscillator and said second filter.

* * * * *

UNITED STATES PATENT AND TRADEMARK OFFICE
CERTIFICATE OF CORRECTION

PATENT NO.        : 7,046,982 B2
APPLICATION NO. : 10/450082
DATED             : May 16, 2006
INVENTOR(S)       : Hiromasa Asano

It is certified that error appears in the above-identified patent and that said Letters Patent is hereby corrected as shown below:

Column 6
Line 37, change "or" to --of--

Column 8
Line 53, change "in" to -- in- --

Signed and Sealed this

Seventeenth Day of October, 2006

JON W. DUDAS
*Director of the United States Patent and Trademark Office*